(12) United States Patent
Zhou et al.

(10) Patent No.: US 12,292,667 B2
(45) Date of Patent: May 6, 2025

(54) ELECTRONIC PAPER, METHOD FOR MANUFACTURING THE SAME, AND DISPLAY DEVICE THEREOF

(71) Applicants: Fuzhou BOE Optoelectronics Technology Co., Ltd., Fujian (CN); BOE Technology Group Co., Ltd., Beijing (CN)

(72) Inventors: Zhiwei Zhou, Beijing (CN); Xin Fang, Beijing (CN); Wenchao Wang, Beijing (CN); Pei Hu, Beijing (CN); Jinliang Wang, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/630,365

(22) PCT Filed: Mar. 18, 2021

(86) PCT No.: PCT/CN2021/081570
§ 371 (c)(1),
(2) Date: Jan. 26, 2022

(87) PCT Pub. No.: WO2022/193239
PCT Pub. Date: Sep. 22, 2022

(65) Prior Publication Data
US 2023/0375892 A1      Nov. 23, 2023

(51) Int. Cl.
*G02F 1/167*      (2019.01)
*G02F 1/1362*     (2006.01)
(Continued)

(52) U.S. Cl.
CPC .......... *G02F 1/167* (2013.01); *G02F 1/13624* (2013.01); *G02F 1/136295* (2021.01);
(Continued)

(58) Field of Classification Search
CPC ........... G02F 1/136295; G02F 1/16766; G02F 1/1685; G02F 1/1368; G02F 1/167;
(Continued)

(56) References Cited

U.S. PATENT DOCUMENTS

2007/0064182 A1*   3/2007   Lin ...................... G02F 1/13624
                                                  349/114
2008/0084603 A1*   4/2008   Song ...................... G02F 1/167
                                                  438/34
(Continued)

FOREIGN PATENT DOCUMENTS

CN             1920627 A         2/2007
CN             104345509 A       2/2015

*Primary Examiner* — Hoan C Nguyen
(74) *Attorney, Agent, or Firm* — IPro, PLLC (57) ABSTRACT

The present disclosure is achieved by providing a first switch unit, a second switch unit, a pixel electrode and an auxiliary electrode in each of the sub-pixel regions of the array substrate; a control end and an input end of the first switch unit are connected to the grid line, the output end of the first switch unit is connected to the auxiliary electrode; and an orthographic projection of the auxiliary electrode on the first substrate at least covers the orthographic projection of the channel region of the second switch unit on the first substrate. Thus, when the electronic paper displays each frame screen, the grid line will input the grid scan signal, the first switch unit is turned on and a positive voltage is charged to the auxiliary electrode, the auxiliary electrode will attract negatively charged white charged particles and repel the positively charged black charged particles.

17 Claims, 7 Drawing Sheets

(51) Int. Cl.
  *G02F 1/1368* (2006.01)
  *G02F 1/16766* (2019.01)
  *G02F 1/1685* (2019.01)
  *G02F 1/16756* (2019.01)

(52) U.S. Cl.
  CPC ........ *G02F 1/1368* (2013.01); *G02F 1/16766* (2019.01); *G02F 1/1685* (2019.01); *G02F 1/16756* (2019.01)

(58) Field of Classification Search
  CPC ............. G02F 1/13624; G02F 1/16756; G02F 1/133555; G02F 1/134309; H01L 21/77; H01L 27/12; H10D 86/441; H10D 86/60; H10D 86/0221; H10D 86/471
  See application file for complete search history.

(56) References Cited

U.S. PATENT DOCUMENTS

| | | | |
|---|---|---|---|
| 2009/0207330 A1* | 8/2009 | Jung | G02F 1/13624 349/39 |
| 2009/0268112 A1* | 10/2009 | Lu | G02F 1/134309 349/187 |
| 2013/0314636 A1* | 11/2013 | Chen | G02F 1/1343 349/43 |
| 2014/0218655 A1* | 8/2014 | Jeong | G02F 1/136286 349/46 |
| 2015/0036072 A1* | 2/2015 | Cho | G02F 1/13624 349/43 |
| 2022/0399382 A1* | 12/2022 | Hua | H01L 27/127 |

* cited by examiner

| forming an array substrate; wherein the array substrate includes a plurality of sub-pixel regions defined by the intersections of a plurality of grid lines and a plurality of data lines, each of the sub-pixel region comprises: an auxiliary electrode provided at one side of a first substrate, a first switch unit connected to the auxiliary electrode, a pixel electrode and a second switch unit connected to the pixel electrode | ─701 |
|---|---|
| forming a cell substrate; the cell substrate is provided with a first common electrode | ─702 |
| injecting electrophoresis solution between the array substrate and the cell substrate, and the electrophoresis solution contains black charged particles and white charged particles | ─703 |

ELECTRONIC PAPER, METHOD FOR MANUFACTURING THE SAME, AND DISPLAY DEVICE THEREOF

TECHNICAL FIELD

The disclosure generally relates to the technical field of display, in particular to provide an electronic paper, method for manufacturing the same, and display device thereof.

BACKGROUND

With advantages such as thin, flexible display and energy-saving, electronic papers have been widely used in the display field, such as billboards, labels, watches, electronic paper readers and so on.

SUMMARY

Some embodiments of the present disclosure provide technical solution as follows:

In the first aspect, an electronic paper is provided, the electronic paper includes: an array substrate, a cell substrate, and electrophoresis solution provided between the array substrate and the cell substrate, and the electrophoresis solution contains black charged particles and white charged particles;

the array substrate includes a plurality of sub-pixel regions defined by intersections of a plurality of grid lines and a plurality of data lines, each of the sub-pixel region comprises: an auxiliary electrode provided on one side of a first substrate, a first switch unit connected to the auxiliary electrode, a pixel electrode, and a second switch unit connected to the pixel electrode;

the cell substrate is provided with a first common electrode, electric field is formed between the first common electrode and the pixel electrode, controlling the black charged particles and the white charged particles in the electrophoresis solution to move to achieve displaying different pictures;

wherein, a control end and an input end of the first switch unit are respectively connected to the grid line, and an output end of the first switch unit is connected to the auxiliary electrode; and the auxiliary electrode is located on one side of the first switch unit away from the first substrate, and an orthographic projection of the auxiliary electrode on the first substrate at least covers the orthographic projection of the channel region of the second switch unit on the first substrate.

In the second aspect, a method for manufacturing an electronic paper is provided. The method includes:

forming an array substrate; wherein the array substrate includes a plurality of sub-pixel regions defined by the intersections of a plurality of grid lines and a plurality of data lines, each of the sub-pixel region comprises: an auxiliary electrode provided at one side of a first substrate, a first switch unit connected to the auxiliary electrode, a pixel electrode and a second switch unit connected to the pixel electrode;

forming a cell substrate; the cell substrate is provided with a first common electrode;

injecting electrophoresis solution between the array substrate and the cell substrate, and the electrophoresis solution contains black charged particles and white charged particles;

wherein electric field is formed between the first common electrode and the pixel electrode, controlling the black charged particles and the white charged particles in the electrophoresis solution to move to achieve displaying different pictures; a control end and an input end of the first switch unit are respectively connected to the grid line, and an output end of the first switch unit is connected to the auxiliary electrode; the auxiliary electrode is located on one side of the first switch unit away from the first substrate, and the orthographic projection of the auxiliary electrode on the first substrate at least covers the orthographic projection of the channel region of the second switch unit on the first substrate.

In the third aspect, a display device is provided. The display device includes the electronic paper defined above.

The above description is only an overview of the technical solution of the present disclosure, which can be implemented according to the contents of the specification in order to understand the technical means of the present disclosure more clearly, and in order to make the above and other objects, features and advantages of the present disclosure more obvious and understandable, the detailed description of the present disclosure will be given below.

BRIEF DESCRIPTION OF THE DRAWINGS

In order to more clearly illustrate the technical solutions of the embodiments of the present disclosure or the prior art, the figures that are required to describe the embodiments or the prior art will be briefly introduced below. Apparently, the figures that are described below are embodiments of the present disclosure, and a person skilled in the art can obtain other figures according to these figures without paying creative work.

DETAILED DESCRIPTION OF THE EMBODIMENTS

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than the embodiments. The other embodiments that a person skilled in the art obtains on the basis of the embodiments of the present disclosure without paying creative work fall within the protection scope of the present disclosure.

In the relative art, electronic paper includes an array substrate, the array substrate has a plurality of sub-pixel regions defined by the intersection of a plurality of grid lines and a plurality of data lines, each of the sub-pixel region provides a switch unit and a pixel electrode connected to the switch unit, and charges the pixel electrode by the switch unit to control the display by the movement of the charged particles between the array substrate and the cell substrate.

In the relative art, when the electronic paper is displaying, external light will directly irradiate the channel region of the switch unit and produce electronic hole pairs, resulting in leakage current from the switch unit and causing poor white spots.

Therefore, the present disclosure is achieved by adding a first switch unit in each sub-pixel region of the array substrate, the control end and the input end of the first switch unit are connected with the grid line, the output end of the first switch unit is connected with the auxiliary electrode, and the orthographic projection of the auxiliary electrode on the first substrate at least covers the orthographic projection of the channel region of the second switch unit on the first substrate, when the electronic paper displays each frame screen, the grid line will input the grid scan signal, thus the first switch unit is turned on and a positive voltage is charged to the auxiliary electrode, therefore, the auxiliary electrode will attract negatively charged white charged particles between the array substrate and the cell substrate, and repel the positively charged black charged particles, then there are black charged particles accumulated above the channel region of the second switch unit. When the external light irradiates the electronic paper, the black charged particles accumulated above the channel region of the second switch unit will block the external light to reduce the external light irradiating the channel region of the second switch unit, thereby improving the leakage current of the second switch unit and reducing the phenomenon of poor white spots.

Figure 1:
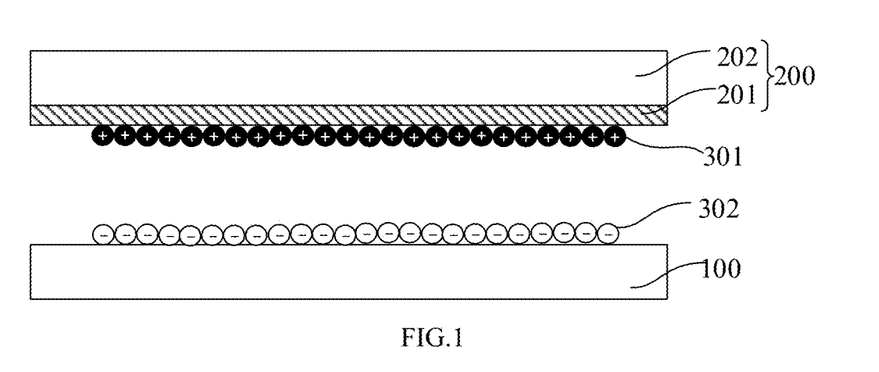
FIG. 1 schematically illustrates a schematic structural diagram of an electronic paper of an embodiment of the present disclosure.
Figure 2:
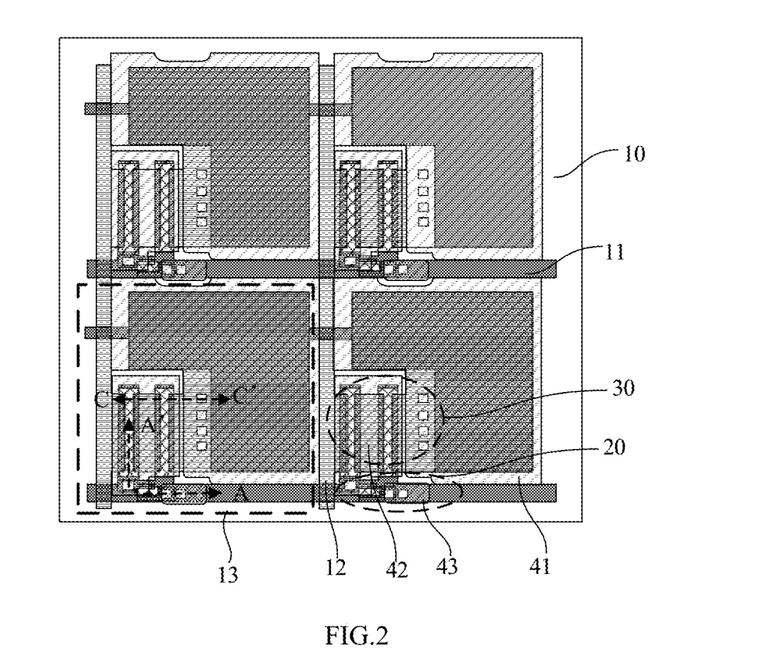
FIG. 2 schematically illustrates a schematic structural diagram of an array matrix of an embodiment of the present disclosure.
Figure 3:
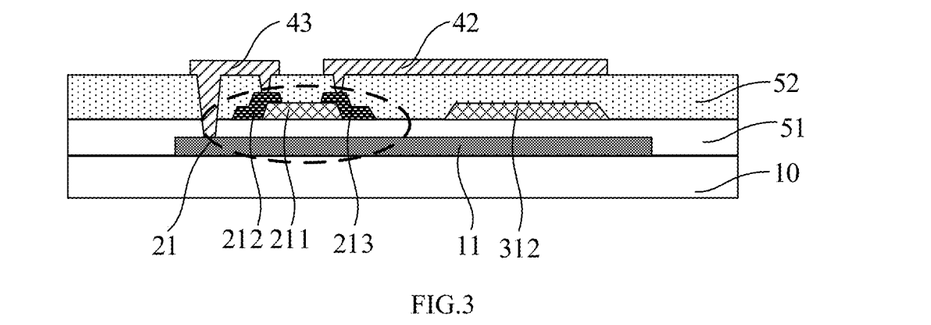
FIG. 3 schematically illustrates a sectional view of the array substrate along the cross-section A-A' as shown in FIG. 2.
Figure 4:
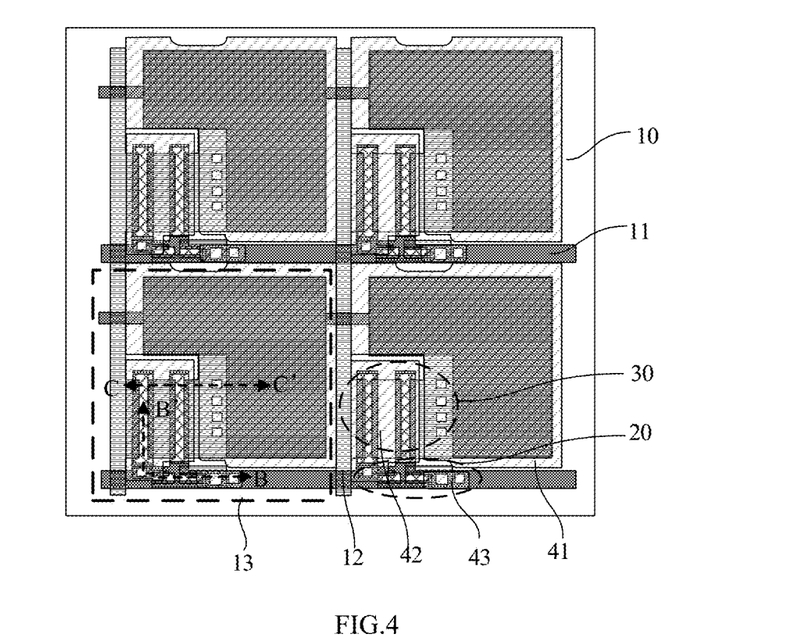
FIG. 4 schematically illustrates a schematic structural diagram of another array substrate of an embodiment of the present disclosure.
Figure 5:
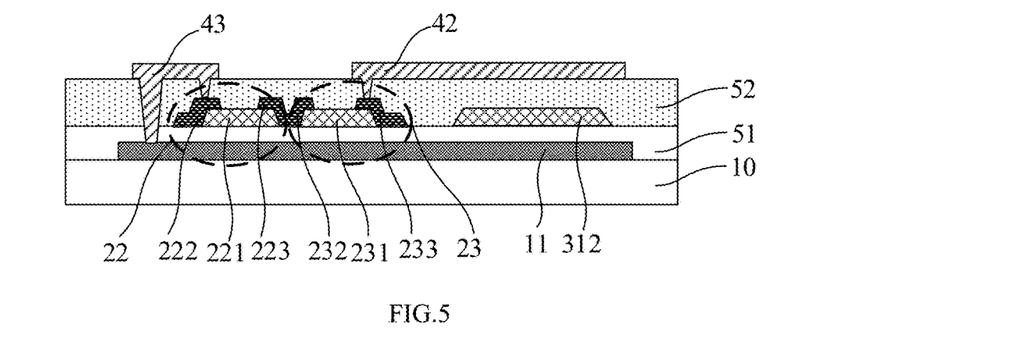
FIG. 5 schematically illustrates a sectional view of the array substrate along the cross-section B-B' as shown in FIG. 4.
Figure 6:
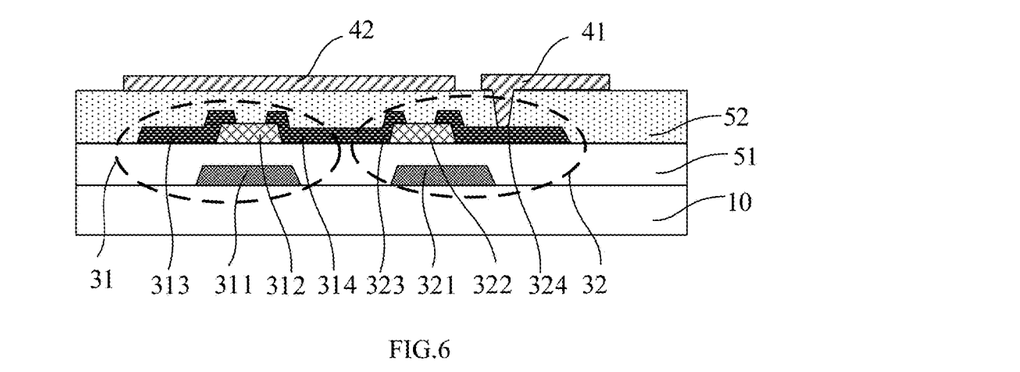
FIG. 6 schematically illustrates a sectional view of the array substrate along the cross-section C-C' as shown in FIG. 2 and FIG. 4.

Refer to FIG. 1, schematically illustrates a schematic structural diagram of an electronic paper of an embodiment of the present disclosure; FIG. 2 illustrates a schematic structural diagram of an array matrix of an embodiment of the present disclosure; FIG. 3 illustrates a sectional view of the array substrate along the cross-section A-A' as shown in FIG. 2; FIG. 4 illustrates a schematic structural diagram of another array substrate of an embodiment of the present disclosure; FIG. 5 illustrates a sectional view of the array substrate along the cross-section B-B' as shown in FIG. 4; FIG. 6 illustrates a sectional view of the array substrate along the cross-section C-C' as shown in FIG. 2 and FIG. 4.

The embodiment of the present disclosure provides an electronic paper, including: an array substrate 100, a cell substrate 200, and electrophoresis solution provided between the array substrate 100 and the cell substrate 200, and the electrophoresis solution contains black charged particles 301 and white charged particles 302.

The array substrate 100 includes a plurality of sub-pixel regions 13 defined by the intersection of a plurality of grid lines 11 and a plurality of data lines 12, each of the sub-pixel region 13 comprises: an auxiliary electrode 42 provided on one side of the first substrate 10, a first switch unit 20 connected to the auxiliary electrode 42, a pixel electrode 41, and a second switch unit 30 connected to the pixel electrode 41; the cell substrate 200 is provided with a first common electrode 201, electric field is formed between the first common electrode 201 and the pixel electrode 41, controlling the black charged particles 301 and the white charged particles 302 in the electrophoresis solution to move to achieve displaying different pictures.

Wherein, a control end and an input end of the first switch unit 20 are respectively connected to the grid line 11, and an output end of the first switch unit 20 is connected to the auxiliary electrode 42; the auxiliary electrode 42 is located on one side of the first switch unit 20 away from the first substrate 10, and an orthographic projection of the auxiliary electrode 42 on the first substrate 10 at least covers the orthographic projection of the channel region of the second switch unit 30 on the first substrate 10.

In actual products, the first substrate 10 in the array substrate 100 may be glass substrate or PI (Polyimide) substrate, etc., a plurality of grid lines 11 and a plurality of data lines 12 are provided on the first substrate 10, each the grid line 11 is distributed along the first direction of the array substrate 100, each the data line 12 is distributed along the second direction of the array substrate 100, the angle between the first direction and the second direction is not 0, for example, the first direction is a row direction, the second direction is a column direction, at the moment, the first direction and the second direction are perpendicular.

Based on the plurality of grid lines 11 and the plurality of data lines 12 provided mutually intersected, the array substrate 100 is divided into a plurality of sub-pixel regions 13 distributed in the array, each sub-pixel region 13 is provided with the first switch unit 20, the second switch unit 30, the pixel electrode 41 and the auxiliary electrode 42, the first switch unit 20 is connected to the auxiliary electrode 42, the second switch unit 30 is connected to the pixel electrode 41.

Wherein, the second switch unit 30 comprises a control end, an input end and an output end, the control end of the second switch unit 30 is connected to the grid line 11, the input end of the second switch unit 30 is connected to the date line 12, the output end of the second switch unit 30 is connected to the pixel electrode 41.

The cell substrate 200 includes a first common electrode 201, electrophoresis solution is provided between the array substrate 100 and the cell substrate 200, specifically, electrophoresis solution is provided between the pixel electrode 41 in the array substrate 100 and the first common electrode 201 in the cell substrate 200, and black charged particles 301 and white charged particles 302 are provided in the electrophoresis solution.

Therefore, when the electronic paper is displaying, the second switch unit 30 is controlled to open by the grid scanning signal transmitted on the grid line 11, to provide the data signal transmitted on the data line 12 to the pixel electrode 41, and the pixel electrode 41 is charged to generate electric field between the pixel electrode 41 and the first common electrode 201 provided on the cell substrate 200, in the action of the electric field, the black charged particles 301 and the white charged particles 302 between the array substrate 100 and the cell substrate 200 move, when the white charged particles 302 rise to the surface of the cell substrate 200 toward the array substrate 100, external light irradiating to the surface of the cell substrate 200 toward the array substrate 100 displays white as reflected by the white charged particles 302, when the black charged particles 301 rise to the surface of the cell substrate 200 toward the array substrate 100, external light irradiating to the surface of the cell substrate 200 toward the array substrate 100 is absorbed and displays black, then the display function is achieved. In other words, the second switch unit 30 is the driving element that drives the electronic paper display.

The first switch unit 20 includes a control end, an input end and an output end, the control end of the first switch unit 20 is connected to the grid line 11, the input end of the first switch unit 20 is connected to the grid line 11, and the output end of the first switch unit 20 is connected to the auxiliary electrode 42.

When the electronic paper displays each frame screen, the grid line 11 will input the grid scanning signal to turn on the first switch unit 20 and charge the auxiliary electrode 42 with positive voltage, and by the action of the grid scanning signal which is repeatedly input by the grid line 11, the auxiliary electrode 42 always maintains positive voltage, thus the auxiliary electrode 42 will attract the negatively charged white charged particles 302 between the array substrate 100 and the cell substrate 200, and repel the positively charged black charged particles 301. And, since the orthographic projection of the auxiliary electrode 42 on the first substrate 10 at least covers the orthographic projection of the channel region of the second switch unit 30 on the first substrate 10, therefore, the black charged particles will accumulate above the channel region of the second switch unit 30 by the auxiliary electrode 42, when the external light irradiates the electronic paper, the black charged particles accumulated above the channel region of the second switch unit 30 will block the external light to reduce the external light irradiating the channel region of the second switch unit 30, thereby improving the leakage current of the second switch unit 30 and reducing the phenomenon of poor white spots.

It should be noted that the voltage of the grid scanning signal may be positive, at the moment, the black charged particles 301 are positive and the white charged particles 302 are negative; certainly, the voltage of the grid scanning signal may also be negative, at the moment, the black charged particles 301 are negative and the white charged particles 302 are positive.

In an optionally embodiment of the present disclosure, referring to the FIG. 2 and FIG. 3, the first switch unit 20 comprises a first transistor 21; the grid electrode of the first transistor 21 is the control end of the first switch unit 20, the first electrode 212 of the first transistor 21 is the input end of the first switch unit 20, the second electrode 213 of the first transistor 21 is the output end of the first switch unit 20; one of the first electrode 212 and the second electrode 213 is a source electrode, and the other is a drain electrode.

Actually, the first switch unit 20 is a transistor, which may merely include a first transistor 21, the first transistor 21 is N-type transistor, at the moment, it needs to guarantee that the voltage of the grid scanning signal is positive, the black charged particles 301 are positive and the white charged particles 302 are negative. Certainly, it can be understood that the first transistor 21 is P-type transistor, at the moment, it needs to guarantee that the voltage of the grid scanning signal is negative, the black charged particles 301 are negative and the white charged particles 302 are positive.

When the first switch unit 20 merely includes a first transistor 21, the grid electrode of the first transistor 21 is connected to the grid line 11, the first electrode 212 of the first transistor 21 is connected to the grid line 11, and the second electrode 213 of the first transistor 21 is connected to the auxiliary electrode 42.

In an optionally embodiment of the present disclosure, referring to the FIG. 4 and FIG. 5, the first switch unit 20 includes a second transistor 22 and a third transistor 23, the second transistor 22 and the third transistor 23 are connected in series; the grid electrode of the second transistor 22 is connected to the grid electrode of the third transistor 23, and the grid electrode of the second transistor 22 and the grid electrode of the third transistor 23 are the control end of the first switch unit 20; the first electrode 222 of the second transistor 22 is the input end of the first switch unit 20, the second electrode 223 of the second transistor 22 is connected to the first electrode 232 of the third transistor 23, the second electrode 233 of the third transistor 23 is the output end of the first switch unit 20; one of the first electrode 222 of the second transistor 22 and the second electrode 223 of the second transistor 22 is a source electrode, and the other is a drain electrode; one of the first electrode 232 of the third transistor 23 and the second electrode 233 of the third transistor 23 is a source electrode, and the other is a drain electrode.

Actually, the first switch unit 20 is transistors, which may comprise two transistors, that are the second transistor 22 and the third transistor 23 respectively, the second transistor 22 and the third transistor 23 are N-type transistors, at the moment, it needs to guarantee that the voltage of the grid scanning signal is positive, the black charged particles 301 are positive and the white charged particles 302 are negative. Certainly, it can be understood that the second transistor 22 and the third transistor 23 are P-type transistors, at the moment, it needs to guarantee that the voltage of the grid scanning signal is negative, the black charged particles 301 are negative and the white charged particles 302 are positive.

When the first switch unit 20 includes a second transistor 22 and a third transistor 23 connected in series, the grid electrode of the second transistor 22 is connected to the grid electrode of the third transistor 23, and both of the grid electrode of the second transistor and the grid electrode of the third transistor are connected to the grid lines 11, the first electrode 222 of the second transistor 22 is connected to the grid line 11, the second electrode 223 of the second transistor 22 is connected to the first electrode 232 of the third transistor 23; the second electrode 233 of the third transistor 23 is connected to the auxiliary electrode 42.

Since the screen refresh frequency of the electronic paper is low and one frame screen is maintained for a long time, in order to ensure that the voltage on the auxiliary electrode 42 can be maintained during the screen display time of each frame screen, which needs the second transistor 22 and the third transistor 23 connected in series together as the first switch unit 20, and the voltage holding capacity of the auxiliary electrode 42 may be improved by opening the second transistor and the third transistor.

It should be noted that when the number of series transistors included by the first switch unit 20 increases, the effect of improving the leakage current of the second switch unit 30 is better, but when the number of transistors in series in the first switch unit 20 increases, it will lead to a smaller open-state current correspondingly, and the problem that occupying the area of the array substrate 100 increases. Thus, in embodiments of the present disclosure, the first switch unit 20 is preferably a first transistor 21, or a second transistor 22 and a third transistor 23 connected in series.

In some embodiments, the first switch unit 20 comprises a first transistor 21, the grid electrode of the first transistor 21 is the grid line 11, the orthographic projections of the first electrode 212 and the second electrode 213 of the first transistor 21 on the first substrate 10 is at least partly located in the orthographic projection of the grid line 11 on the first substrate 10.

In another embodiments, the first switch unit 20 comprises a second transistor 22 and a third transistor 23 connected in series; the grid electrode of the second transistor 22 and the grid electrode of the third transistor 23 are grid lines 11, the orthographic projection of the first electrode 222 of the second transistor 22, the orthographic projection of the second electrode 223 of the second transistor 22, the orthographic projection of the first electrode 232 of the third transistor 23 and the orthographic projection of the second electrode 233 of the third transistor 23 on the first substrate 10 are at least partly located in the orthographic projection of the grid line 11 on the first substrate 10.

By setting the grid line 11 as the control end of the first switch unit 20, in other words, setting the grid line 11 as the grid electrode of the first transistor 21, or as the grid electrodes of the second transistor 22 and the third transistor 23, the structural design of the first switch unit 20 may be simplified; and the orthographic projections of the source electrodes and drain electrodes of the transistors included by the first switch unit 20 are provided to be at least partly located within the orthographic projections of the grid lines 11 on the first substrate 10, ensuring that the area occupied by the new first switch unit 20 is smaller.

In the actual product, the first switch unit 20 comprises a first grid layer, a grid insulating layer 51, a first active layer and a first source-drain electrode layer arranged on the first substrate 10 in layer configuration; in other words, the first grid layer is provided on the first substrate 10, the grid insulating layer 51 covers the first grid layer and the first substrate 10, the first active layer is provided at one side of the grid insulating layer 51 away from the first substrate 10, the first source-drain electrode layer is further provided at one side of the grid insulating layer 51 away from the first substrate 10.

Referring to FIG. 3, the first switch unit 20 comprises a first transistor 21, the grid electrode of the first transistor 21 is located in the first grid layer, the first electrode 212 of the first transistor 21 and the second electrode 213 of the first transistor 21 are located in the first source-drain electrode layer; and the first active layer comprises a first active sub-layer 211, the first electrode 212 of the first transistor 21 and the second electrode 213 of the first transistor 21 partly cover the first active sub-layer 211.

Referring to FIG. 5, the first switch unit 20 comprises a second transistor 22 and a third transistor 23 connected in series; the grid electrode of the second transistor 22 and the grid electrode of the third transistor 23 are located in the first grid layer, the first electrode 222 of the second transistor 22, the second electrode 223 of the second transistor 22, the first electrode 232 of the third transistor 23, the second electrode 233 of the third transistor 23 are all located in the first source-drain electrode layer; and the first active layer comprises a second active sub-layer 221 and a third active sub-layer 231, the first electrode 222 of the second transistor 22 and the second electrode 223 of the second transistor 22 partly cover the second active sub-layer 221; the first electrode 232 of the third transistor 23 and the second electrode 233 of the third transistor 23 partly cover the third active sub-layer 231.

Wherein, when the first switch unit 20 comprises a first transistor 21, the orthographic projections of the first active sub-layer 211 on the first substrate 10 are located in the orthographic projections of the grid line 11 on the first substrate 10; when the first switch unit 20 comprises a second transistor 22 and a third transistor 23 connected in series, the orthographic projections of the second active sub-layer 221 and the third active sub-layer 231 on the first substrate 10 are located in the orthographic projections of the grid line 11 on the first substrate 10.

Referring to FIG. 6, the second switch unit 30 comprises a fourth transistor 31 and a fifth transistor 32, the fourth transistor 31 and the fifth transistor 32 are connected in series; the grid electrode 311 of the fourth transistor 31 is connected with the grid electrode 321 of the fifth transistor 32, and the grid electrode 311 of the fourth transistor 31 and the grid electrode 321 of the fifth transistor 32 are the control end of the second switch unit 30; the first electrode 313 of the fourth transistor 31 is the input end of the second switch unit 30, the second electrode 314 of the fourth transistor 31 is connected with the first electrode 323 of the fifth transistor 32, the second electrode 324 of the fifth transistor 32 is the output end of the second switch unit 30.

In other words, the grid electrode 311 of the fourth transistor 31 and the grid electrode 321 of the fifth transistor 32 are connected to the grid lines 11, the first electrode 313 of the fourth transistor 31 is connected to the data line 12, the second electrode 314 of the fourth transistor 31 is connected to the first electrode 323 of the fifth transistor 32, the second electrode 324 of the fifth transistor 32 is connected to the pixel electrode 41.

Wherein, one of the first electrode 313 and the second electrode 314 of the fourth transistor 31 is a source electrode, and the other is a drain electrode; one of the first electrode 323 and the second electrode 324 of the fifth transistor 32 is a source electrode, and the other is a drain electrode.

And, the fourth transistor 31 and the fifth transistor 32 may be N-type transistors or P-type transistors. However the type of transistors of the first switch unit 20 needs to be the same to the type of transistors of the second switch unit 30. For instance, when the first transistor 21 is N-type transistor, the fourth transistor 31 and the fifth transistor 32 are further the N-type transistors, when the first transistor 21 is P-type transistor, the fourth transistor 31 and the fifth transistor 32 are also the P-type transistors.

It should be noted that the second switch unit 30 may also merely comprise a transistor, such as the sixth transistor, the grid electrode of the sixth transistor is the control end of the second switch unit 30, the first electrode of the sixth transistor is the input end of the second switch unit 30, the second electrode of the sixth transistor is the output end of the second switch unit 30.

In the actual product, the second switch unit 30 comprises a second grid layer, the grid insulating layer 51, a second active layer and a second source-drain electrode layer arranged on the first substrate 10 in layer configuration. That is, the second grid layer is provided on the first substrate 10, the grid insulating layer 51 covers the second grid layer and the first substrate 10, the second active layer is provided on one side of the grid insulating layer 51 away from the first substrate 10, the second source-drain electrode layer is also provided at one side of the grid insulating layer 51 away from the first substrate 10.

Referring to FIG. 6, the grid electrode 311 of the fourth transistor 31 and the grid electrode 321 of the fifth transistor 32 are located in the second grid layer, the first electrode 313 of the fourth transistor 31, the second electrode 314 of the fourth transistor 31, the first electrode 323 of the fifth transistor 32, the second electrode 324 of the fifth transistor 32 are located in the second source-drain electrode layer; and the second active layer comprises a fourth active sub-layer 312 and a fifth active sub-layer 322, the first electrode 313 of the fourth transistor 31 and the second electrode 314 of the fourth transistor 31 partly cover the fourth active sub-layer 312, the first electrode 323 of the fifth transistor 32 and the second electrode 324 of the fifth transistor 32 partly cover the fifth active sub-layer 322.

At the moment, the channel region of the second switch unit 30 refers to: the region of the fourth active sub-layer 312 which is uncovered by the first electrode 313 of the fourth transistor 31 and the second electrode 314 of the fourth transistor 31, and the region of the fifth active sub-layer 322 which is uncovered by the first electrode 323 of the fifth transistor 32 and the second electrode 324 of the fifth transistor 32.

In some embodiments, the orthographic projection of the auxiliary electrode 42 on the first substrate 10 further covers the orthographic projection of the first electrode 313 of the fourth transistor 31, the orthographic projection of the second electrode 314 of the fourth transistor 31, the orthographic projection of the first electrode 323 of the fifth transistor 32 and part of the orthographic projection of the second electrode 324 of the fifth transistor 32 on the first substrate 10.

When the electronic paper is displaying, there is external light of various angels incident into the electronic paper, in order to avoid the light oblique incident into the electronic paper (i. e., the light that the angle between the incident light and the normal direction of the light-exiting surface of the electronic paper is not 0) irradiating to the channel region of the second switch unit 30, it is required that the orthographic projections of the auxiliary electrode 42 on the first substrate 10 further cover the orthographic projection of the first electrode 313 of the fourth transistor 31, the orthographic projection of the second electrode 314 of the fourth transistor 31, the orthographic projection of the first electrode 323 of the fifth transistor 32 and the orthographic projection of part of the second electrode 324 of the fifth transistor 32 on the first substrate 10, thus, the external light irradiating to the channel region of the second switch unit 30 is further reduced, to further improve the leakage current of the second switch unit 30.

It should be noted that when the second switch unit 30 merely comprises a sixth transistor, the orthographic projections of the auxiliary electrode 42 on the first substrate 10 further cover the orthographic projection of the first electrode of the sixth transistor and part of the orthographic projection of the second electrode of the sixth transistor on the first substrate 10.

In some embodiments, the first grid layer and the second grid layer are disposed on the same layer; the first active layer and the second active layer are disposed on the same layer; the data line 12, the first source-drain electrode layer and the second source-drain electrode layer are disposed on the same layer.

Wherein, when the first switch unit 20 comprises a first transistor 21, the first grid layer comprises the grid electrode of the first transistor 21, while the grid electrode of the first transistor 21 is the grid line 11, thus the grid line 11 is also located in the first grid layer; when the first switch unit 20 includes a second transistor 22 and a third transistor 23 connected in series, the first grid layer comprises the grid electrode of the second transistor 22 and the grid electrode of the third transistor 23, and the grid electrode of the second transistor 22 and the grid electrode of the third transistor 23 are the grid lines 11, thus the grid lines 11 are also located in the first grid layer. When the second switch unit 30 includes a fourth transistor 31 and a fifth transistor 32 connected in series, the second grid layer includes the grid electrode 311 of the fourth transistor 31 and the grid electrode 321 of the fifth transistor 32. That the first grid layer and the second grid layer are disposed on the same layer refers to: the grid line 11, the grid electrode 311 of the fourth transistor 31 and the grid electrode 321 of the fifth transistor 32 are disposed on the same layer.

When the first switch unit 20 includes a first transistor 21, the first active layer is the first active sub-layer 211, and the second active layer includes the fourth active sub-layer 312 and the fifth active sub-layer 322, thus, that the first active layer and the second active layer are disposed on the same layer refers to: the first active sub-layer 211, the fourth active sub-layer 312 and the fifth active sub-layer 322 are disposed on the same layer. When the first switch unit 20 includes a second transistor 22 and a third transistor 23 connected in series, the first active layer includes the second active sub-layer 221 and the third active sub-layer 231, and the second active layer includes the fourth active sub-layer 312 and the fifth active sub-layer 322, thus, that the first active layer and the second active layer are disposed on the same layer refers to: the second active sub-layer 221, the third active sub-layer 231, the fourth active sub-layer 312 and the fifth active sub-layer 322 are disposed on the same layer.

When the first switch unit 20 includes a first transistor 21, the first source-drain electrode layer includes the first electrode 212 of the first transistor 21 and the second electrode 213 of the first transistor 21, and the second source-drain electrode layer includes the first electrode 313 of the fourth transistor 31, the second electrode 314 of the fourth transistor 31, the first electrode 323 of the fifth transistor 32, the second electrode 324 of the fifth transistor 32, thus, the date lines 12, the first electrode 212 of the first transistor 21, the second electrode 213 of the first transistor 21, the first electrode 313 of the fourth transistor 31, the second electrode 314 of the fourth transistor 31, the first electrode 323 of the fifth transistor 32, the second electrode 324 of the fifth transistor 32 are disposed on the same layer.

When the first switch unit 20 includes a second transistor 22 and a third transistor 23 connected in series, the first source-drain electrode includes the first electrode 222 of the second transistor 22, the second electrode 223 of the second transistor 22, the first electrode 232 of the third transistor 23 and the second electrode 233 of the third transistor 23, thus, that the date line 12, the first source-drain electrode layer and the second source-drain electrode layer are disposed on the same layer refers to: the date line 12, the first electrode 222 of the second transistor 22, the second electrode 223 of the second transistor 22, the first electrode 232 of the third transistor 23, the second electrode 233 of the third transistor 23, the first electrode 313 of the fourth transistor 31, the second electrode 314 of the fourth transistor 31, the first electrode 323 of the fifth transistor 32 and the second electrode 324 of the fifth transistor 32 are disposed on the same layer.

In embodiments of the present disclosure, referring to the FIG. 1 to FIG. 6, the array substrate 100 further includes the passivation layer 52 covering the first switch unit 20 and the second switch unit 30, and a bridge electrode 43 disposed on the passivation layer 52; the pixel electrode 41 and the auxiliary electrode 42 are located on one side of the passivation layer 52 away from the first switch unit 20; the bridge electrode 43 is connected with the grid line 11 via a first through hole throughout the passivation layer 52 and the grid insulating layer 51, the bridge electrode 43 is further connected with the input end of the first switch unit 20 via a second through hole throughout the passivation layer 52; the auxiliary electrode 42 is connected with the output end of the first switch unit 20 via a third through hole throughout the passivation layer 52; the pixel electrode 41 is connected with the output end of the second switch unit 30 via a fourth through hole throughout the passivation layer 52.

When the first switch unit 20 includes a first transistor 21, the bridge electrode 43 is connected with the first electrode 212 of the first transistor 21 via the second through hole throughout the passivation layer 52, the auxiliary electrode 42 is connected with the second electrode 213 of the first transistor 21 via the third through hole throughout the passivation layer 52; when the first switch unit 20 includes the second transistor 22 and the third transistor 23 connected in series, the bridge electrode 43 is connected with the first electrode 222 of the second transistor 22 via the second through hole throughout the passivation layer 52, the auxiliary electrode 42 is connected with the second electrode 233 of the third transistor 23 via the third through hole throughout the passivation layer 52; and the pixel electrode 41 is connected with the second electrode 324 of the fifth transistor 32 via the fourth through hole throughout the passivation layer 52. The action of the bridge electrode 43 is to achieve that the input end of the first switch unit 20 is connected to the grid line 11.

In some embodiments, the bridge electrode 43, the pixel electrode 41 and the auxiliary electrode 42 are disposed on the same layer, and the orthographic projections of the bridge electrode 43, the pixel electrode 41 and the auxiliary electrode 42 on the first substrate 10 have no overlap with each other, and any two orthographic projections are separated by a space.

In other words, any two of the bridge electrodes 43, the pixel electrode 41 and the auxiliary electrode 42 will not be mutually contacted to avoid that the first switch unit 20 and the second switch unit 30 cannot operate normally by the interaction between the electrodes.

Wherein, the materials of the bridge electrode 43, the pixel electrode 41 and the auxiliary electrode 42 are same and are ITO (Indium Tin Oxides), certainly, the materials of the bridge electrode 43, the pixel electrode 41 and the auxiliary electrode 42 may also be other metal or oxide conductor material.

In some embodiments, the array substrate 100 further comprises the second common electrodes provided at one side of the first substrate 10 and located in each sub-pixel region 13; the second common electrodes of any neighboring two of the sub-pixel region 13 are connected with one another, and the second common electrodes are connected to the ground end.

The cell substrate 200 comprises a second substrate 202 and a first common electrode 201 provided at one side of the second substrate 202 close to the array substrate 100, and the first common electrode 201 is connected with the second common electrodes.

The second common electrodes are used to connected to the first common electrodes 201 disposed on the cell substrate 200, to make the first common electrodes 201 to be connected to the ground end, when the pixel electrode 41 on the array substrate 100 is charged voltage, electric field is formed between the first common electrode 201 and the pixel electrode 41, controlling the white charged particles 302 and the black charged particles 301 between the pixel electrode 41 and the first common electrode 201 to move to achieve the function of displaying.

Wherein the second common electrodes, the grid lines 11, the grid electrode 311 of the fourth transistor 31 and the grid electrode 321 of the fifth transistor 32 are disposed on the same layer.

It should be noted that the first common electrode 201 is a face electrode, the orthographic projection of the first common electrode 201 on the array substrate 100 covers the pixel electrode 41, the auxiliary electrode 42 and the bridge electrode 43 in each sub-pixel region 13.

In embodiments of the present disclosure, by adding a first switch unit in each sub-pixel region of the array substrate, the control end and the input end of the first switch unit are connected with the grid line, the output end of the first switch unit is connected with the auxiliary electrode, and the orthographic projection of the auxiliary electrode on the first substrate at least covers the orthographic projection of the channel region of the second switch unit on the first substrate, when the electronic paper displays each frame screen, the grid line will input the grid scan signal, thus the first switch unit is turned on and a positive voltage is charged to the auxiliary electrode, therefore, the auxiliary electrode will attract negatively charged white charged particles between the array substrate and the cell substrate, and repel the positively charged black charged particles, then there are black charged particles accumulated above the channel region of the second switch unit. When the external light irradiates the electronic paper, the black charged particles accumulated above the channel region of the second switch unit will block the external light to reduce the external light irradiating the channel region of the second switch unit, thereby improving the leakage current of the second switch unit and reducing the phenomenon of poor white spots.

Figure 7:
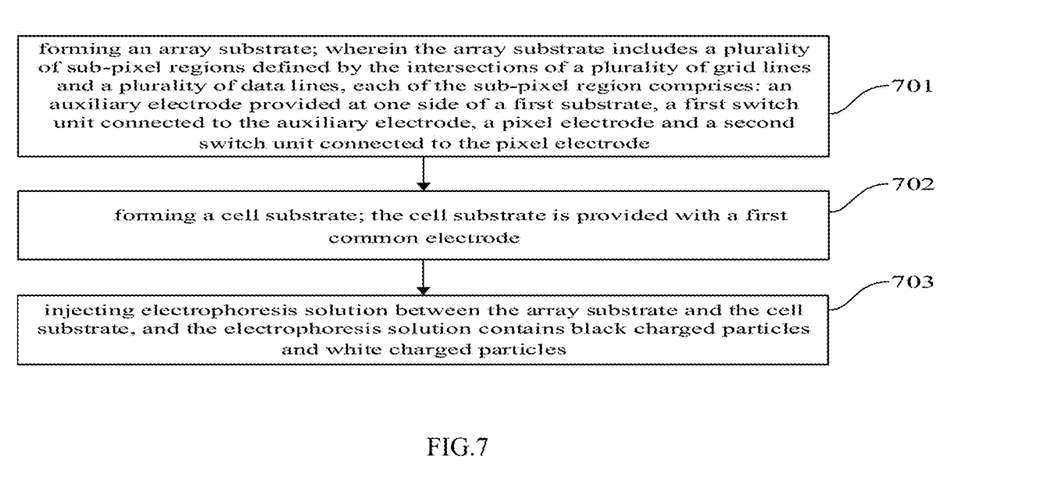
FIG. 7 schematically illustrates a flow chart of a method for manufacturing an electronic paper of an embodiment of the present disclosure.

Referring to FIG. 7, illustrating a flow chart of a method for manufacturing an electronic paper of an embodiment of the present disclosure, specifically the method may include the steps as follows:

step 701, forming an array substrate; wherein the array substrate includes a plurality of sub-pixel regions defined by intersections of a plurality of grid lines and a plurality of data lines, each of the sub-pixel region comprises: an auxiliary electrode provided at one side of a first substrate, a first switch unit connected to the auxiliary electrode, a pixel electrode and a second switch unit connected to the pixel electrode.

In embodiments of the present disclosure, first, providing a first substrate 10, the first substrate 10 includes the plurality of sub-pixel regions 13 defined by the intersections of the plurality of grid lines 11 and the plurality of data lines 12 subsequently formed, then each of the sub-pixel regions 13 on the first substrate 10 respectively forms the first switch unit 20, the second switch unit 30, the pixel electrode 41 and the auxiliary electrode 42.

Wherein, a control end and an input end of the first switch unit 20 are respectively connected to the grid line 11, and an output end of the first switch unit 20 is connected to the auxiliary electrode 42; the auxiliary electrode 42 is located on one side of the first switch unit 20 away from the first substrate 10, and an orthographic projection of the auxiliary electrode 42 on the first substrate 10 at least covers the orthographic projection of the channel region of the second switch unit 30 on the first substrate 10.

Specifically, step 701 includes sub-step 7011 to sub-step 7016:

- sub-step 7011, forming a first grid layer and a second grid layer on the first substrate;
- sub-step 7012, forming a grid insulating layer which covers the first grid layer, the second grid layer and the first substrate;
- sub-step 7013, forming a first active layer and a second active layer on the grid insulating layer;
- sub-step 7014, forming the date line, a first source-drain electrode layer and a second source-drain electrode layer on the grid insulating layer;
- sub-step 7015, forming a passivation layer which covers the date line, the first source-drain electrode layer, the second source-drain electrode layer, the first active layer, the second active layer and the grid insulating layer; and
- sub-step 7016, forming a bridge electrode, the pixel electrode and the auxiliary electrode on the passivation layer.

Figure 8:
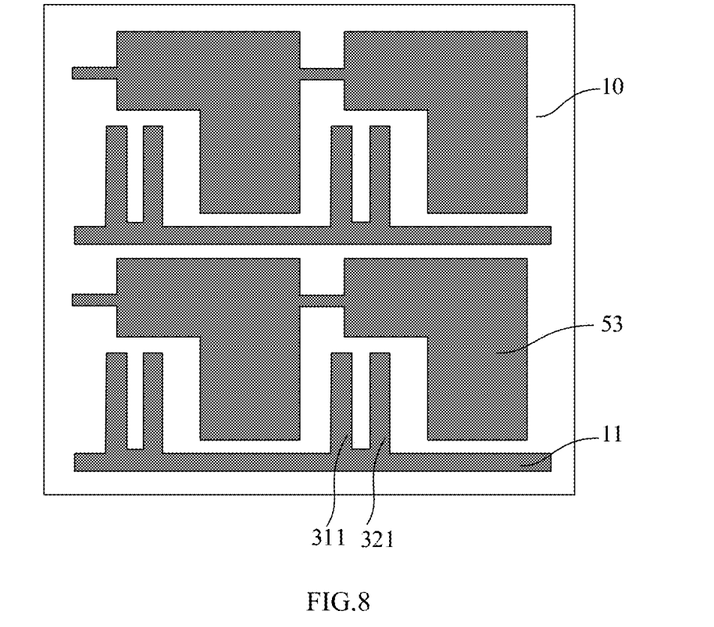
FIG. 8 schematically illustrates a schematic structural diagram of the first substrate on which the first grid layers and the second grid layer are formed.

Referring to FIG. 8, using a patterning process, the first grid layer and the second grid layer are formed on the first substrate 10. Wherein, the control end of the first switch unit 20 is the grid line 11, and the grid line 11 is located in the first grid layer, that is, the first grid layer includes the grid line 11. Specifically, when the first switch unit 20 includes a first transistor 21, the first grid layer includes the grid electrode of the first transistor 21, and the grid electrode of the first transistor 21 is the grid line 11; when the first switch unit 20 includes a second transistor 22 and a third transistor 23 connected in series, the first grid layer includes the grid electrode of the second transistor 22 and the grid electrode of the third transistor 23, and the grid electrode of the second transistor 22 and the grid electrode of the third transistor 23 are the grid lines 11.

The control end of the second switch unit 30 is located in the second grid layer. Specifically, when the second switch unit 30 includes a fourth transistor 31 and a fifth transistor 32 connected in series, the second grid layer includes the grid electrode 311 of the fourth transistor 31 and the grid electrode 321 of the fifth transistor 32, and the grid electrode 311 of the fourth transistor 31 and the grid electrode 321 of the fifth transistor 32 are connected with the grid lines 11.

Furthermore, when the array substrate 100 further includes the second common electrode 53 disposed on the first substrate 10 and located in each of the sub-pixel regions 13, the second common electrode 53 may also be formed on the first substrate 10 by using a pattering process, this moment, the second common electrode 53, the grid line 11, the grid electrode 311 of the fourth transistor 31 and the grid electrode 321 of the fifth transistor 32 are disposed on the same layer, and the orthographic projection of the second common electrode 53 on the first substrate 10 is separated by a space with the orthographic projection of the grid line 11, the orthographic projection of the grid electrode 311 of the fourth transistor 31 and the orthographic projection of the grid electrode 321 of the fifth transistor 32 on the first substrate 10.

After forming the first grid layer and the second grid layer on the first substrate 10, the grid insulating layer 51 covering the first grid layer, the second grid layer and the first substrate 10 can be formed, the grid insulating layer 51 can be formed by Chemical Vapor Deposition (CVD) process, and the material of the grid insulating layer 51 is inorganic material, such as at least one of silicon nitride and silicon oxide.

Then, using a patterning process, the first active layer and the second active layer are formed on the grid insulating layer 51.

Figure 9:
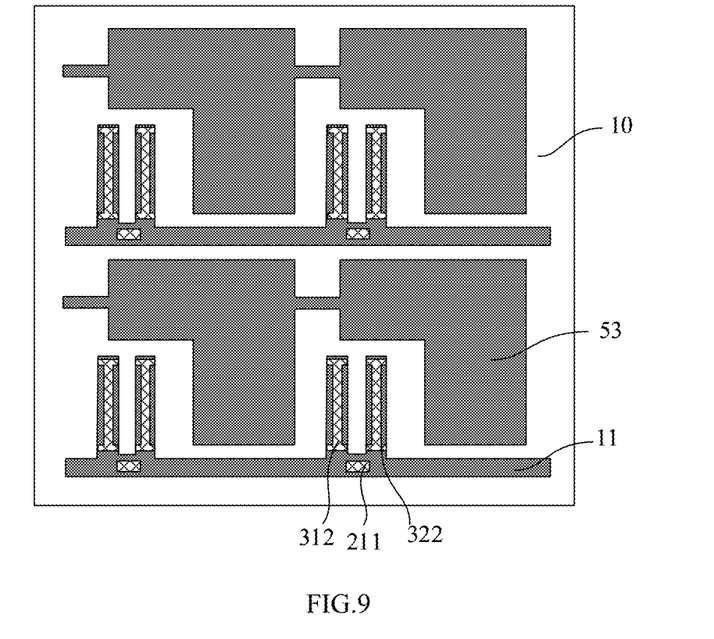
FIG. 9 schematically illustrates a schematic structural diagram that the first active layer and the second active layer are formed on the basis of FIG. 8.

In some embodiments, referring to FIG. 9, when the first switch unit 20 includes a first transistor 21, the first active layer is the first active sub-layer 211, and the second active layer includes the fourth active sub-layer 312 and the fifth active sub-layer 322. Wherein the orthographic projection of the first active sub-layer 211 on the first substrate 10 is located in the orthographic projection of the grid line 11 on the first substrate 10.

Figure 12:
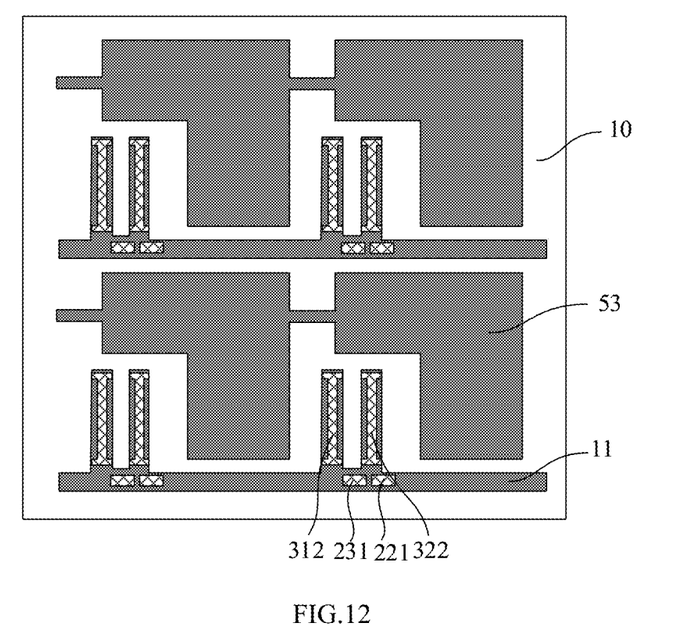
FIG. 12 schematically illustrates another schematic structural diagram of forming the first active layer and the second active layer on the basis of FIG. 8.

In other embodiments, referring to FIG. 12, when the first switch unit 20 includes a second transistor 22 and a third transistor 23 connected in series, the first active layer includes the second active sub-layer 221 and the third active sub-layer 231, and the second active layer includes the fourth active sub-layer 312 and the fifth active sub-layer 322. Wherein, the orthographic projection of the second active sub-layer 221 and the orthographic projection of the third active sub-layer 231 on the first substrate 10 are located in the orthographic projection of the grid line 11 on the first substrate 10.

Referring to FIG. 9 and FIG. 12, the orthographic projection of the fourth active sub-layer 312 on the first substrate 10 is located in the grid electrode 311 of the fourth transistor 31 on the first substrate 10, the orthographic projection of the fifth active sub-layer 322 on the first substrate 10 is located in the orthographic projection of the grid electrode 321 of the fifth transistor 32 on the first substrate 10, After forming the first active layer and the second active layer on the grid insulating layer 51, the data line 12, the first source-drain electrode layer and the second source-drain electrode layer are formed on the grid insulating layer 51 by using a patterning process. Wherein the input end of the first switch unit 20 and the output end of the first switch unit 20 are located in the first source-drain electrode layer, the input end of the second switch unit 30 and the output end of the second switch unit 30 are located in the second source-drain electrode layer.

Figure 10:
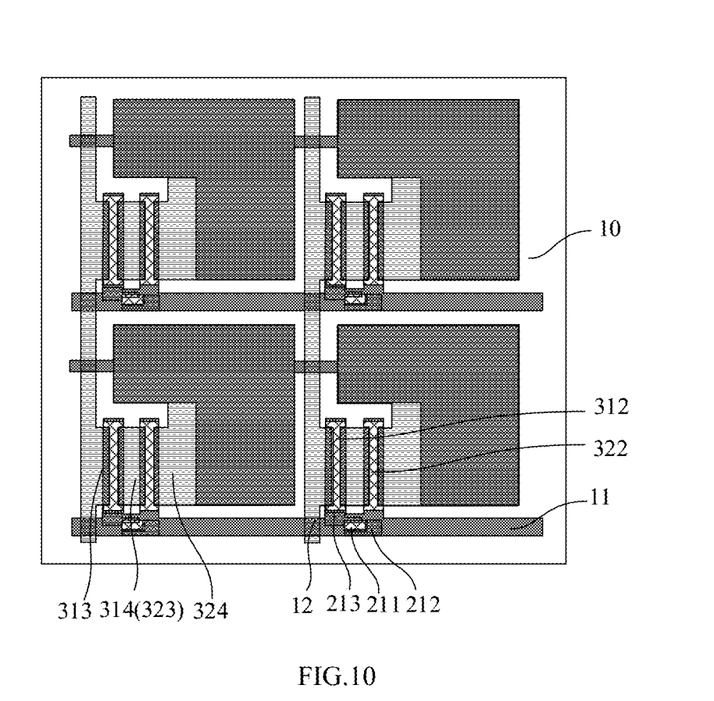
FIG. 10 schematically illustrates a schematic structural diagram that data line, the first source-drain electrode layer, and the second source-drain electrode layer are formed on the basis of FIG. 9.

In some embodiments, referring to FIG. 10, when the first switch unit 20 includes a first transistor 21, the first electrode 212 of the first transistor 21 is the input end of the first switch unit 20, the second electrode 213 of the first transistor 21 is the output end of the first switch unit 20. Thus, the first source-drain electrode layer includes the first electrode 212 of the first transistor 21 and the second electrode 213 of the first transistor 21, and the first electrode 212 of the first transistor 21 and the second electrode 213 of the first transistor 21 partly cover the first active sub-layer 211.

Figure 13:
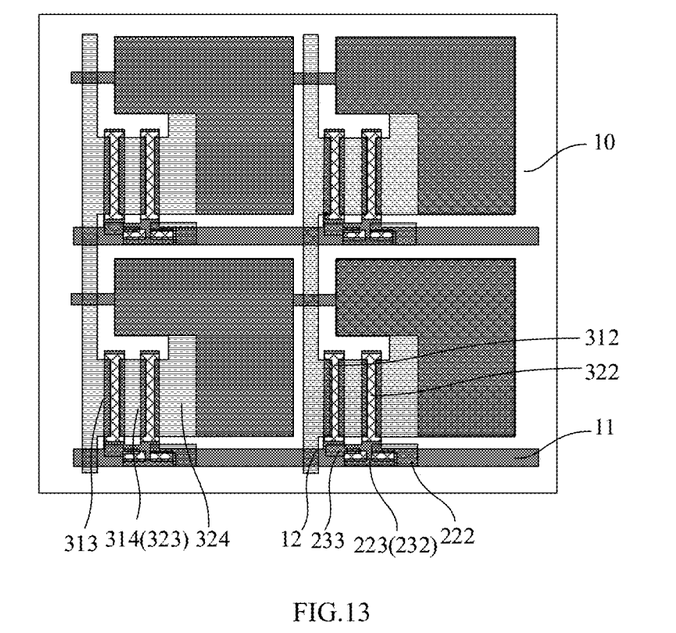
FIG. 13 schematically illustrates another schematic structural diagram that data line, the first source-drain electrode layer, and the second source-drain electrode layer are formed on the basis of FIG. 12.

In other embodiments, referring to FIG. 13, when the first switch unit 20 includes a second transistor 22 and a third transistor 23 connected in series, the first electrode 222 of the second transistor 22 is the input end of the first switch unit 20, the second electrode 223 of the second transistor 22 is connected to the first electrode 232 of the third transistor 23, the second electrode 233 of the third transistor 23 is the output end of the first switch unit 20. Thus, the first source-drain electrode layer includes the first electrode 222 of the second transistor 22, the second electrode 223 of the second transistor 22, the first electrode 232 of the third transistor 23 and the second electrode 233 of the third transistor 23, the first electrode 222 of the second transistor 22 and the second electrode 223 of the second transistor 22 partly cover the second active sub-layer 221, the first electrode 232 of the third transistor 23 and the second electrode 233 of the third transistor 23 partly cover the third active sub-layer 231.

Referring to FIG. 10 and FIG. 13, the second switch unit 30 includes a fourth transistor 31 and a fifth transistor 32 connected in series, the first electrode 313 of the fourth transistor 31 is the input end of the second switch unit 30, the second electrode 314 of the fourth transistor 31 is connected to the first electrode 323 of the fifth transistor 32, the second electrode 324 of the fifth transistor 32 is the output end of the second switch unit 30. Thus the second source-drain electrode layer includes the first electrode 313 of the fourth transistor 31, the second electrode 314 of the fourth transistor 31, the first electrode 323 of the fifth transistor 32 and the second electrode 324 of the fifth transistor 32, and the first electrode 313 of the fourth transistor 31 and the second electrode 314 of the fourth transistor 31 partly cover the fourth active sub-layer 312, the first electrode 323 of the fifth transistor 32 and the second electrode 324 of the fifth transistor 32 partly cover the fifth active sub-layer 322.

Figure 11:
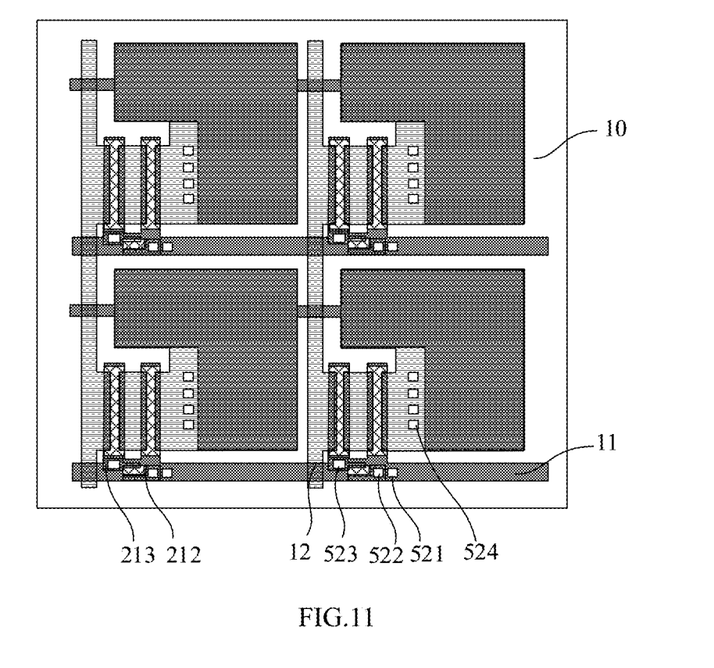
FIG. 11 schematically illustrates a schematic structural diagram of forming through holes through the passivation layer on the basis of FIG. 10.
Figure 14:
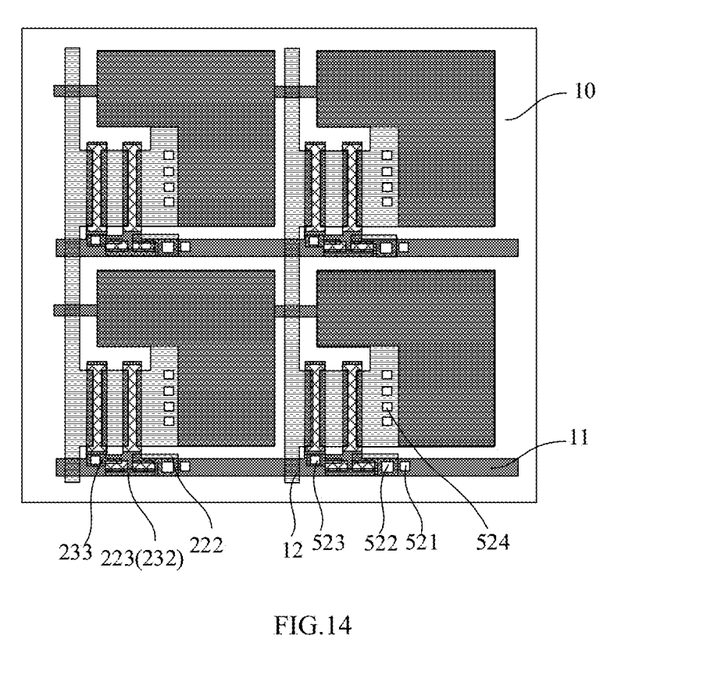
FIG. 14 schematically illustrates another schematic structural diagram of forming through holes through the passivation layer on the basis of FIG. 13.

After forming the data line 12, the first source-drain electrode layer and the second source-drain electrode layer on the grid insulating layer 51, referring to FIG. 11 and FIG. 14, a passivation layer 52 which covers the date line 12, the first source-drain electrode layer, the second source-drain electrode layer, the first active layer, the second active layer and the grid insulating layer 51 is formed; and photoresist is coated on the passivation layer 52, after exposure and development of the photoresist, the passivation layer 52 at the photoresist removal area is etched, a transition hole, a second through hole 522, a third through hole 523 and a fourth through hole 524 throughout the passivation layer 52 are formed, then the grid insulating layer 51 at the location of the transition hole is etched, finally the first through hole 521 throughout the passivation layer 52 and the grid insulating layer 51 is formed.

In the end, the bridge electrode 43, the pixel electrode 41 and the auxiliary electrode 42 are formed on the passivation layer 52 using a pattering process. Wherein, the bridge electrode 43 is connected with the grid line 11 via the first through hole 521 throughout the passivation layer 52 and the grid insulating layer 51, the bridge electrode 43 is further connected with the input end of the first switch unit 20 via the second through hole 522 throughout the passivation layer 52; the auxiliary electrode 42 is connected with the output end of the first switch unit 20 by the third through hole 523 throughout the passivation layer 52; and the pixel electrode 41 is connected with the output end of the second switch unit 30 via the fourth through hole 524 throughout the passivation layer 52.

It should be noted that, after forming the bridge electrode 43, the pixel electrode 41 and the auxiliary electrode 42 on the structure showed in the FIG. 11, the array substrate 100 as shown in FIG. 2 can be obtained, after forming the bridge electrode 43, the pixel electrode 41 and the auxiliary electrode 42 on the structure showed in the FIG. 14, the array substrate 100 as shown in FIG. 4 can be obtained.

In embodiments of the present disclosure, the first grid layer and the second grid layer are formed at a same time using a same pattering process; the first active layer and the second active layer are formed at a same time using a same pattering process; the date line 12, the first source-drain electrode layer and the second source-drain electrode layer are formed at a same time using a same pattering process; the bridge electrode 43, the pixel electrode 41 and the auxiliary electrode 42 are formed at a same time using a same pattering process.

When the film layer structure in the same layer at a same time using a same pattering process, the process steps of the array substrate 100 can be simplified.

Step 702, forming a cell substrate; the cell substrate is provided with a first common electrode.

In embodiments of the present disclosure, a second substrate 202 is provided, and a common electrode 201 is formed on the second substrate 202 using a deposition process, to obtain the cell substrate 200, the material of the first common electrode 201 is transparent conductive material, such as ITO etc.

Step 703, injecting electrophoresis solution between the array substrate and the cell substrate, and the electrophoresis solution contains black charged particles and white charged particles.

In embodiments of the present disclosure, after forming the array substrate 100 and the cell substrate 200, electrophoresis solution between the array substrate 100 and the cell substrate 200 is injected, and the electrophoresis solution contains black charged particles 301 and white charged particles 302.

Wherein electric field is formed between the first common electrode 201 and the pixel electrode 41, controlling the black charged particles 301 and the white charged particles 302 in the electrophoresis solution to move to achieve displaying different pictures.

In embodiments of the present disclosure, by adding a first switch unit in each sub-pixel region of the array substrate, the control end and the input end of the first switch unit are connected with the grid line, the output end of the first switch unit is connected with the auxiliary electrode, and the orthographic projection of the auxiliary electrode on the first substrate at least covers the orthographic projection of the channel region of the second switch unit on the first substrate, when the electronic paper displays each frame screen, the grid line will input the grid scan signal, thus the first switch unit is turned on and a positive voltage is charged to the auxiliary electrode, therefore, the auxiliary electrode will attract negatively charged white charged particles between the array substrate and the cell substrate, and repel the positively charged black charged particles, then there are black charged particles accumulated above the channel region of the second switch unit. When the external light irradiates the electronic paper, the black charged particles accumulated above the channel region of the second switch unit will block the external light to reduce the external light irradiating the channel region of the second switch unit, thereby improving the leakage current of the second switch unit and reducing the phenomenon of poor white spots.

Embodiments of the present disclosure also disclose a display device, including the electronic paper defined above.

Furthermore, the display device also includes a driver chip connected with the grid line 11 and the data line 12 in the electronic paper.

The term "an embodiment", "embodiment" or "one or more embodiments" herein means that particular features, structures or peculiarity described in combination with embodiments are included in at least one embodiment of the present disclosure. Furthermore, note that the examples of words "in an embodiment" here do not necessarily all refer to the same embodiment.

In the specification provided here, numerous specific details are given. However, it can be understood that the embodiments of the present disclosure may be practiced without these specific details. In some embodiments, the public methods, structures, and technology are not shown in detail so that the understanding of this specification is not blurred.

In claims, the reference symbols located between brackets should not be regarded as a limitation to the claim. The word "contain" does not exclude the existence of elements or steps not listed in the claim. The word "a" or "one" preceding the element does not exclude the existence of a plurality of such elements. The present disclosure may be implemented by the aid of hardware comprising several different elements and by the aid of a properly programmed computer. In the claims listing several devices, several of these devices may be specifically embodied by the same hardware item. The use of the words first, second, and third etc. do not indicate any order. These words can be interpreted as names.

Finally, it should be noted that the above embodiments are merely used to illustrate the technical solution of the present disclosure, not to restrict them; although the present disclosure is illustrated in detail referring to the previous embodiments, ordinary persons skilled in the art should understand: they can still modify the technical solution set forth by the previous embodiments or equally replace part of the technical features, these modifications or replacement do not take the nature of the corresponding technical solution out of the spirit and scope of the technical solution of the embodiments of the present disclosure.

The invention claimed is:

1. An electronic paper, comprising: an array substrate, a cell substrate, and electrophoresis solution provided between the array substrate and the cell substrate, and the electrophoresis solution contains black charged particles and white charged particles;
   the array substrate includes a plurality of sub-pixel regions defined by intersections of a plurality of grid lines and a plurality of data lines, each of the sub-pixel region comprises: an auxiliary electrode provided on one side of a first substrate, a first switch unit connected to the auxiliary electrode, a pixel electrode, and a second switch unit connected to the pixel electrode;
   the cell substrate is provided with a first common electrode, electric field is formed between the first common electrode and the pixel electrode, controlling the black charged particles and the white charged particles in the electrophoresis solution to move to achieve displaying different pictures;
   wherein, a control end and an input end of the first switch unit are respectively connected to the grid line, and an output end of the first switch unit is connected to the auxiliary electrode; and
   the auxiliary electrode is located on one side of the first switch unit away from the first substrate, and an orthographic projection of the auxiliary electrode on the first substrate at least covers the orthographic projection of the channel region of the second switch unit on the first substrate;
   wherein the second switch unit comprises a fourth transistor and a fifth transistor connected in series;
   a grid electrode of the fourth transistor is connected with a grid electrode of the fifth transistor, and the grid electrode of the fourth transistor and the grid electrode of the fifth transistor are the control end of the second switch unit; and
   a first electrode of the fourth transistor is the input end of the second switch unit, a second electrode of the fourth transistor is connected with the first electrode of the fifth transistor, the second electrode of the fifth transistor is the output end of the second switch unit;
   wherein the orthographic projection of the auxiliary electrode on the first substrate further covers the orthographic projection of the first electrode of the fourth transistor, the orthographic projection of the second electrode of the fourth transistor, the orthographic projection of the first electrode of the fifth transistor and the orthographic projection of part of the second electrode of the fifth transistor on the first substrate.

2. The electronic paper according to claim 1, wherein the first switch unit comprises a first transistor;
   a grid electrode of the first transistor is the control end of the first switch unit, a first electrode of the first transistor is the input end of the first switch unit, a second electrode of the first transistor is the output end of the first switch unit; and
   one of the first electrode and the second electrode is a source electrode, and the other is a drain electrode.

3. The electronic paper according to claim 2, wherein the grid electrode of the first transistor is the grid line; the orthographic projections of the first electrode and the orthographic projections of the second electrode of the first transistor on the first substrate is at least partly located in the orthographic projection of the grid line on the first substrate.

4. The electronic paper according to claim 2, wherein the first switch unit comprises a first grid layer, a grid insulating layer, a first active layer and a first source-drain electrode layer arranged on the first substrate in layer configuration;
   wherein the first switch unit comprises a first transistor, the grid electrode of the first transistor is located in the first grid layer, the first electrode of the first transistor and the second electrode of the first transistor are located in the source-drain electrode layer; and the first active layer comprises a first active sub-layer, the first electrode of the first transistor and the second electrode of the first transistor partly cover the first active sub-layer;
   or,
   the first switch unit comprises a second transistor and a third transistor connected in series; the grid electrode of the second transistor and the grid electrode of the third transistor are located in the first grid layer, the first electrode of the second transistor, the second electrode of the second transistor, the first electrode of the third transistor, the second electrode of the third transistor are located in the first source-drain electrode layer; and the first active layer comprises a second active sub-layer and a third active sub-layer, the first electrode of the second transistor and the second electrode of the second transistor cover the second active sub-layer partly; the first electrode of the third transistor and the second electrode of the third transistor cover the third active sub-layer partly.

5. The electronic paper according to claim 1, wherein the first switch unit comprises a second transistor and a third transistor connected in series;
   a grid electrode of the second transistor is connected to a grid electrode of the third transistor, and the grid electrode of the second transistor and the grid electrode of the third transistor are the control end of the first switch unit;

a first electrode of the second transistor is the input end of the first switch unit, a second electrode of the second transistor is connected to the first electrode of the third transistor, a second electrode of the third transistor is the output end of the first switch unit; and one of the first electrode and the second electrode is a source electrode, and the other is a drain electrode.

6. The electronic paper according to the claim 5, wherein the grid electrode of the second transistor and the grid electrode of the third transistor are grid line; the orthographic projection of the first electrode of the second transistor, the orthographic projection of the second electrode of the second transistor, the orthographic projection of the first electrode and the orthographic projection of the second electrode of the third transistor on the first substrate are at least partly located in the orthographic projection of the grid line on the first substrate.

7. The electronic paper according to claim 5, wherein the first switch unit comprises a first grid layer, a grid insulating layer, a first active layer and a first source-drain electrode layer arranged on the first substrate in layer configuration;

wherein the first switch unit comprises a first transistor, the grid electrode of the first transistor is located in the first grid layer, the first electrode of the first transistor and the second electrode of the first transistor are located in the source-drain electrode layer; and the first active layer comprises a first active sub-layer, the first electrode of the first transistor and the second electrode of the first transistor partly cover the first active sub-layer;

or, the first switch unit comprises a second transistor and a third transistor connected in series; the grid electrode of the second transistor and the grid electrode of the third transistor are located in the first grid layer, the first electrode of the second transistor, the second electrode of the second transistor, the first electrode of the third transistor, the second electrode of the third transistor are located in the first source-drain electrode layer; and the first active layer comprises a second active sub-layer and a third active sub-layer, the first electrode of the second transistor and the second electrode of the second transistor cover the second active sub-layer partly; the first electrode of the third transistor and the second electrode of the third transistor cover the third active sub-layer partly.

8. The electronic paper according to claim 1, wherein the second switch unit comprises a second grid layer, the grid insulating layer, a second active layer and a second source-drain electrode layer arranged on the first substrate in layer configuration;

the grid electrode of the fourth transistor and the grid electrode of the fifth transistor are located in the second grid layer, the first electrode of the fourth transistor, the second electrode of the fourth transistor, the first electrode of the fifth transistor and the second electrode of the fifth transistor are located in the second source-drain electrode layer; and the second active layer comprises a fourth active sub-layer and a fifth active sub-layer, the first electrode of the fourth transistor and the second electrode of the fourth transistor partly cover the fourth active sub-layer; the first electrode of the fifth transistor and the second electrode of the fifth transistor partly cover the fifth active sub-layer.

9. The electronic paper according to claim 8, wherein the first grid layer and the second grid layer are disposed on the same layer;

the first active layer and the second active layer are disposed on the same layer; and the data line, the first source-drain electrode layer and the second source-drain electrode layer are disposed on the same layer.

10. The electronic paper according to claim 1, wherein the array substrate further comprises the second common electrodes provided at one side of the first substrate and located in each sub-pixel region; and the second common electrodes of any neighboring two of the sub-pixel region is connected with one another, and the second common electrodes are connected to a ground end.

11. The electronic paper according to claim 10, wherein the cell substrate comprises a second substrate and a first common electrode provided at one side of the second substrate close to the array substrate, and the first common electrode is connected with the second common electrodes.

12. A display device, comprising the electronic paper according to claim 1.

13. An electronic paper, comprising: an array substrate, a cell substrate, and electrophoresis solution provided between the array substrate and the cell substrate, and the electrophoresis solution contains black charged particles and white charged particles;

the array substrate includes a plurality of sub-pixel regions defined by intersections of a plurality of grid lines and a plurality of data lines, each of the sub-pixel region comprises: an auxiliary electrode provided on one side of a first substrate, a first switch unit connected to the auxiliary electrode, a pixel electrode, and a second switch unit connected to the pixel electrode;

the cell substrate is provided with a first common electrode, electric field is formed between the first common electrode and the pixel electrode, controlling the black charged particles and the white charged particles in the electrophoresis solution to move to achieve displaying different pictures;

wherein, a control end and an input end of the first switch unit are respectively connected to the grid line, and an output end of the first switch unit is connected to the auxiliary electrode; and the auxiliary electrode is located on one side of the first switch unit away from the first substrate, and an orthographic projection of the auxiliary electrode on the first substrate at least covers the orthographic projection of the channel region of the second switch unit on the first substrate;

wherein the first switch unit comprises a first grid layer, a grid insulating layer, a first active layer and a first source-drain electrode layer arranged on the first substrate in layer configuration;

wherein the first switch unit comprises a first transistor, the grid electrode of the first transistor is located in the first grid layer, the first electrode of the first transistor and the second electrode of the first transistor are located in the source-drain electrode layer; and the first active layer comprises a first active sub-layer, the first electrode of the first transistor and the second electrode of the first transistor partly cover the first active sub-layer;

wherein the array substrate further comprises a passivation layer which covers the first switch unit and the second switch unit, and a bridge electrode disposed on the passivation layer; the pixel electrode and the auxiliary electrode are located on one side of the passivation layer away from the first switch unit;

the bridge electrode is connected with the grid line via a first through hole throughout the passivation layer and the grid insulating layer, the bridge electrode is further connected with the input end of the first switch unit via a second through hole throughout the passivation layer;

the auxiliary electrode is connected with the output end of the first switch unit via a third through hole throughout the passivation layer; and the pixel electrode is connected with the output end of the second switch unit via a fourth through hole throughout the passivation layer.

14. The electronic paper according to claim 13, wherein the bridge electrode, the pixel electrode and the auxiliary electrode are disposed on the same layer, and the orthographic projections of the bridge electrode, the pixel electrode and the auxiliary electrode on the first substrate have no overlap with each other, and any two orthographic projections are separated by a space.

15. A method for manufacturing an electronic paper, comprising:

forming an array substrate; wherein the array substrate includes a plurality of sub-pixel regions defined by intersections of a plurality of grid lines and a plurality of data lines, each of the sub-pixel region comprises: an auxiliary electrode provided on one side of a first substrate, a first switch unit connected to the auxiliary electrode, a pixel electrode and a second switch unit connected to the pixel electrode;

forming a cell substrate; the cell substrate is provided with a first common electrode;

injecting electrophoresis solution between the array substrate and the cell substrate, and the electrophoresis solution contains black charged particles and white charged particles;

wherein electric field is formed between the first common electrode and the pixel electrode, controlling the black charged particles and the white charged particles in the electrophoresis solution to move to achieve displaying different pictures; a control end and an input end of the first switch unit are respectively connected to the grid line, and an output end of the first switch unit is connected to the auxiliary electrode; the auxiliary electrode is located on one side of the first switch unit away from the first substrate, and an orthographic projection of the auxiliary electrode on the first substrate at least covers the orthographic projection of the channel region of the second switch unit on the first substrate;

wherein the second switch unit comprises a fourth transistor and a fifth transistor connected in series;

a grid electrode of the fourth transistor is connected with a grid electrode of the fifth transistor, and the grid electrode of the fourth transistor and the grid electrode of the fifth transistor are the control end of the second switch unit; and a first electrode of the fourth transistor is the input end of the second switch unit, a second electrode of the fourth transistor is connected with the first electrode of the fifth transistor, the second electrode of the fifth transistor is the output end of the second switch unit;

wherein the orthographic projection of the auxiliary electrode on the first substrate further covers the orthographic projection of the first electrode of the fourth transistor, the orthographic projection of the second electrode of the fourth transistor, the orthographic projection of the first electrode of the fifth transistor and the orthographic projection of part of the second electrode of the fifth transistor on the first substrate.

16. The method according to claim 15, wherein the step of the forming the array substrate comprises:

forming a first grid layer and a second grid layer on the first substrate;

forming a grid insulating layer which covers the first grid layer, the second grid layer and the first substrate;

forming a first active layer and a second active layer on the grid insulating layer;

forming the date line, a first source-drain electrode layer and a second source-drain electrode layer on the grid insulating layer;

forming a passivation layer which covers the date line, the first source-drain electrode layer, the second source-drain electrode layer, the first active layer, the second active layer and the grid insulating layer;

forming a bridge electrode, the pixel electrode and the auxiliary electrode on the passivation layer;

wherein, the control end of the first switch unit is the grid line, and the grid line is located in the first grid layer, the input end of the first switch unit and the output of the first switch unit are located in the first source-drain electrode layer; the control end of the second switch unit is located in the second grid layer, the input end of the second switch unit and the output of the second switch unit are located in the second source-drain electrode layer; and the bridge electrode is connected with the grid line via a first through hole throughout the passivation layer and the grid insulating layer, the bridge electrode is further connected with the input end of the first switch unit via a second through hole throughout the passivation layer; the auxiliary electrode is connected with the output end of the first switch unit by a third through hole throughout the passivation layer; the pixel electrode is connected with the output end of the second switch unit via a fourth through hole throughout the passivation layer.

17. The method according to claim 16, wherein the first grid layer and the second grid layer are formed at a same time using a same pattering process;

the first active layer and the second active layer are formed at a same time using a same pattering process;

the date line, the first source-drain electrode layer and the second source-drain electrode layer are formed at a same time using a same pattering process; and the bridge electrode, the pixel electrode and the auxiliary electrode are formed at a same time using a same pattering process.

* * * * *